United States Patent
Han et al.

(10) Patent No.: US 10,177,273 B2
(45) Date of Patent: Jan. 8, 2019

(54) UV LIGHT EMITTING DEVICE

(71) Applicant: SEOUL VIOSYS CO., LTD., Ansan-si (KR)

(72) Inventors: Chang Suk Han, Ansan-si (KR); Hwa Mok Kim, Ansan-si (KR); Hyo Shik Choi, Ansan-si (KR); Mi So Ko, Ansan-si (KR); A Ram Cha Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/811,253

(22) Filed: Jul. 28, 2015

(65) Prior Publication Data

US 2015/0333218 A1 Nov. 19, 2015

Related U.S. Application Data

(63) Continuation-in-part of application No. 13/853,361, filed on Mar. 29, 2013, now Pat. No. 9,224,913.

(30) Foreign Application Priority Data

| Mar. 29, 2012 | (KR) | 10-2012-0032195 |
| Mar. 12, 2013 | (KR) | 10-2013-0025989 |
| Jul. 29, 2014 | (KR) | 10-2014-0096626 |

(51) Int. Cl.
*H01L 33/32* (2010.01)
*H01L 33/06* (2010.01)
(Continued)

(52) U.S. Cl.
CPC .......... *H01L 33/06* (2013.01); *H01L 33/0025* (2013.01); *H01L 33/12* (2013.01);
(Continued)

(58) Field of Classification Search
CPC ......... H01L 33/06; H01L 33/32; H01L 33/04; H01L 2924/0002; H01L 2924/00; H01L 33/25; H01L 33/12
(Continued)

(56) References Cited

U.S. PATENT DOCUMENTS

| 2005/0127391 A1* | 6/2005 | Yanamoto | B82Y 20/00 |
| | | | 257/103 |
| 2011/0017976 A1 | 1/2011 | Khan et al. | |

(Continued)

FOREIGN PATENT DOCUMENTS

| JP | H09-232629 | 9/1997 |
| JP | 2001-148507 | 5/2001 |

(Continued)

OTHER PUBLICATIONS

Non-Final Office Action issued on Jun. 6, 2014, in U.S. Appl. No. 13/853,361.

(Continued)

*Primary Examiner* — Joseph Galvin, III
(74) *Attorney, Agent, or Firm* — H.C. Park & Associates, PLC

(57) ABSTRACT

A UV light emitting device includes: an n-type contact layer including an AlGaN layer or an AlInGaN layer; a p-type contact layer including a AlGaN layer or an AlInGaN layer; and an active layer of a multi-quantum well structure placed between the n-type contact layer and the p-type contact layer. The active area of the multi-quantum well structure includes barrier layers and well layers. The well layers include electrons and holes present according to probability distributions thereof. The barrier layers are formed of AlInGaN or AlGaN and have an Al content of 10% to 30%. At least one of the barrier layers disposed between the well layers has a smaller thickness than of the well layers and at least one of the barrier layers placed between the well layers (Continued)

has a thickness and a band gap preventing electrons and holes injected into and confined in a well layer adjacent to the barrier layer from spreading into another adjacent well layer.

19 Claims, 8 Drawing Sheets

(51) Int. Cl.
  *H01L 33/00* (2010.01)
  *H01L 33/12* (2010.01)
  *H01L 33/04* (2010.01)
  *H01L 33/14* (2010.01)
(52) U.S. Cl.
  CPC .............. *H01L 33/32* (2013.01); *H01L 33/04* (2013.01); *H01L 33/14* (2013.01)
(58) Field of Classification Search
  USPC ........................ 257/13, 15, 25, 79, E33.02
  See application file for complete search history.

(56) References Cited

U.S. PATENT DOCUMENTS

2011/0140079 A1  6/2011  Jang et al.
2011/0253974 A1  10/2011  Horie et al.
2012/0037881 A1* 2/2012  Kim ...................... H01L 33/007
                                                        257/13

FOREIGN PATENT DOCUMENTS

JP    2003-115642      4/2003
KR    10-2012-0129449  11/2012
WO    2011/083940      7/2011

OTHER PUBLICATIONS

Final Office Action issued on Jan. 16, 2015, in U.S. Appl. No. 13/853,361.
Non-Final Office Action issued on Apr. 24, 2015, in U.S. Appl. No. 13/853,361.
Notice of Allowance dated Feb. 3, 2016, in U.S. Appl. No. 14/526,110.
Non Final Office Action dated Dec. 30, 2016, in U.S. Appl. No. 15/096,252.
Japanese Office Action dated Jan. 10, 2017, in Japanese Application No. 2015-503124.
Notice of Allowance dated Aug. 13, 2018, in U.S. Appl. No. 15/096,252.

* cited by examiner

UV LIGHT EMITTING DEVICE

CROSS REFERENCE TO RELATED APPLICATIONS

This application is a continuation-in-part of U.S. patent application Ser. No. 13/853,361, filed on Mar. 29, 2013, now issued as U.S. Pat. No. 9,224,913, and claims priority from and the benefit of Korean Patent Application No. 10-2012-0032195, filed on Mar. 29, 2012, Korean Patent Application No. 10-2013-0025989, filed on Mar. 12, 2013, and Korean Patent Application No. 10-2014-0096626, filed on Jul. 29, 2014, which are incorporated by reference for all purposes as if fully set forth herein.

BACKGROUND

Field

The present invention relates to an inorganic semiconductor light emitting device, and more particularly, to an ultraviolet light emitting device.

Discussion of the Background

Generally, a gallium nitride-based semiconductor has been widely used in a blue/green light emitting diode or a laser diode as a light source of full color displays, traffic lighting, general lamps and optical communication instruments. In particular, an indium gallium nitride (InGaN) compound semiconductor has attracted considerable attention due to its narrow band gap.

This gallium nitride-based compound semiconductor has been utilized in various fields such as large-sized natural color flat panel display devices, light sources of backlight units, traffic lights, indoor lighting fixtures, high density light sources, high resolution output systems, optical communication, and the like. A light emitting device for emitting near ultraviolet light has been used in forgery discrimination, resin curing and ultraviolet treatment, and can realize various colors of visible light in combination with a fluorescent substance.

Near ultraviolet light refers to ultraviolet light at wavelengths ranging from about 320 nm to 390 nm. Gallium nitride GaN has an energy band gap of about 3.42 eV, which correspond to optical energy at a wavelength of about 365 nm. Accordingly, a light emitting device including an InGaN well layer can be used to emit near ultraviolet light at wavelengths of 365 nm or greater, that is, wavelengths from 365 nm to 390 nm according to In content.

Since light produced in the well layer is emitted to the outside through a barrier layer and a contact layer, a plurality of semiconductor layers is located in a path along which light travels, and light absorption occurs due to the semiconductor layers. In particular, when the semiconductor layers have a band gap smaller than or similar to those of the well layers, significant light loss occurs. In particular, it is necessary to control light absorption due to an n-type contact layer and a p-type contact layer occupying most of the thickness of the light emitting device.

Thus, in the near ultraviolet light emitting device in the related art, barrier layers, n-type contact layers, and p-type contact layers as well as electron blocking layers are formed of AlGaN which has a greater band gap than InGaN. However, since it is difficult to grow AlGaN relatively thick while ensuring good crystallinity of AlGaN, electric and optical characteristics of the near ultraviolet light emitting device are inferior to those of blue light emitting devices, and the near ultraviolet light emitting device is sold at a higher price than blue/green light emitting devices.

FIG. 5 is a schematic sectional view of a typical light emitting diode and FIG. 6 is an enlarged sectional view of an active area of the light emitting diode of FIG. 5.

Referring to FIG. 5 and FIG. 6, the light emitting diode includes a substrate 111, a three-dimensional growth layer 113, an n-type contact layer 115, an active area 117, a p-type contact layer 119, an n-electrode 110, and a p-electrode 120. In such a typical light emitting diode, the active area 117 having a multi-quantum well structure is placed between the n-type contact layer 115 and the p-type contact layer 119 to improve luminous efficacy and can emit light of a desired wavelength by adjusting the In content of InGaN well layers in the multi-quantum well structure.

GaN has a band gap of about 3.42 eV, which corresponds to energy of light having a wavelength of about 365 nm. Accordingly, a light emitting diode using GaN or InGaN in a well layer, which may improve luminous efficiency due to a difference in band gap between the well layer and a barrier layer, emits blue light or UV light having a wavelength of about 400 nm or more. In order to provide a light emitting diode emitting UV light having a wavelength of 400 nm or less, it is necessary to increase the band gaps of the well layers and the barrier layers. To this end, well layers formed by adding Al to GaN or InGaN are used (see Korean Patent Publication No. 10-2012-0129449A).

In the active area that includes well layers comprised of InGaN and emits light having a wavelength of 400 nm or more, there may be a large difference in band gap between the GaN or InGaN barrier layers and the well layers to provide high quantum efficiency within the well layers. However, in order to improve quantum efficiency in the active area including the well layers having an band gap capable of emitting light having a wavelength of 400 nm or less by adding Al to GaN or InGaN, the barrier layers may have a higher band gap.

Referring to FIG. 6, in the active area 117 of the typical light emitting diode, barrier layers 117b have a greater thickness than well layers 117w. This structure may improve luminous efficiency through maximization of a recombination rate between holes and electrons in the well layers 117w. More specifically, the well layers and the barrier layers are alternatively stacked one above another in at least one pair. When electrons and holes are injected into the well layer and confined therein, each of the electrons and holes may not be regarded as a single particle. That is, the electrons and the holes confined in the well layer are probabilistically present within the quantum well structure according to the probability distribution thereof. The probability distribution of electrons and holes can be represented by a distribution graph by existence probability according to the principle of uncertainty. Accordingly, although the electrons and the holes may be injected into the well layers in the active area, there is a possibility of existence of the electrons and the holes in the barrier layers according to the probability distributions thereof.

Electrons and holes injected into each of well layers adjacent to a barrier layer interposed therebetween are also distributed according to the probability distributions thereof, and there is a possibility of transition of the electrons and the holes into adjacent well layers as well as the well layer into which the electrons and the holes are directly injected. The probability distributions of the electrons and the holes in the adjacent well layers may probabilistically overlap each other, and a thinner thickness of the barrier layer may result in a higher degree of overlapping between the probability distributions of the electrons and the holes in the adjacent well layers. A phenomenon in which the probability distributions of the electrons and the holes included in the adjacent well layers overlap each other is referred to as an overlap of the probability distributions.

A higher degree of overlap of the probability distributions causes an accordingly high possibility of transition of electrons and holes into adjacent well layers, and thus, likelihood of recombination of electrons and holes is lowered, thereby reducing internal quantum efficiency. Accordingly, in order to improve internal quantum efficiency, the barrier layer must have a sufficient thickness or a high band gap to block transition of electrons and/or holes into adjacent well layers.

In the related art, the barrier layer may be formed to have a certain thickness in order to block transition of electrons and holes into adjacent well layers. That is, the thickness of the barrier layer is set to be greater than or equal to a thickness at which the probability distributions of electrons and holes of well layers adjacent to the barrier layer do not overlap each other. The thickness of the barrier layer at which the probability distributions of electrons and holes of the well layers adjacent to the barrier layer do not overlap each other may be referred to as a skin depth of the barrier layer. The skin depth of the barrier layer is lowered as a difference in band gap between the well layer and the barrier layer increases and the thickness of the well layer increases. For example, in an active area having a structure wherein a GaN barrier layer is formed on an InGaN well layer containing 15% In and a thickness of 2 nm to 3 nm to emit light having a wavelength of about 460 nm to about 440 nm, since the barrier layer has a skin depth of about 5 nm when a difference in conduction band energy between the well layer and the barrier layer is 370 meV, the well layer may have a thickness of 10 nm to 15 nm.

As such, in the related art, since the thickness of the barrier layers may be greater than or equal to the skin depth of the barrier layers, the barrier layers 117b have a thick thickness. Accordingly, the barrier layers acts as blocking barriers in transfer of electrons and holes into each of the well layers 117w. Thus, the drive voltage of the light emitting diode is increased and electrons and holes are unevenly injected into the well layers, thereby causing deterioration in internal quantum efficiency.

Therefore, there is a need for development of a light emitting diode that includes an active area in which barrier layers have a greater thickness and a high band gap.

SUMMARY

An aspect of the present invention is to improve light output and light extraction efficiency of a gallium nitride-based near ultraviolet light emitting device.

Another aspect of the present invention is to provide a near ultraviolet light emitting device that can be easily manufactured.

Additional features of the invention will be set forth in the description which follows, and in part will be apparent from the description, or may be learned by practice of the invention.

In accordance with an exemplary embodiment, a UV light emitting device includes: an n-type contact layer including an AlGaN layer or an AlInGaN layer; a p-type contact layer including a AlGaN layer or an AlInGaN layer; and an active layer of a multi-quantum well structure placed between the n-type contact layer and the p-type contact layer. The active area of the multi-quantum well structure includes barrier layers and well layers. The well layers include electrons and holes present according to probability distributions thereof. The barrier layers are formed of AlInGaN or AlGaN and have an Al content of 10% to 30%. At least one of the barrier layers disposed between the well layers has a smaller thickness than of the well layers and at least one of the barrier layers placed between the well layers has a thickness and a band gap preventing electrons and holes injected into and confined in a well layer adjacent to the barrier layer from spreading into another adjacent well layer.

It is to be understood that both the foregoing general description and the following detailed description are exemplary and explanatory and are intended to provide further explanation of the invention as claimed.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION OF THE ILLUSTRATED EMBODIMENTS

Figure 1:
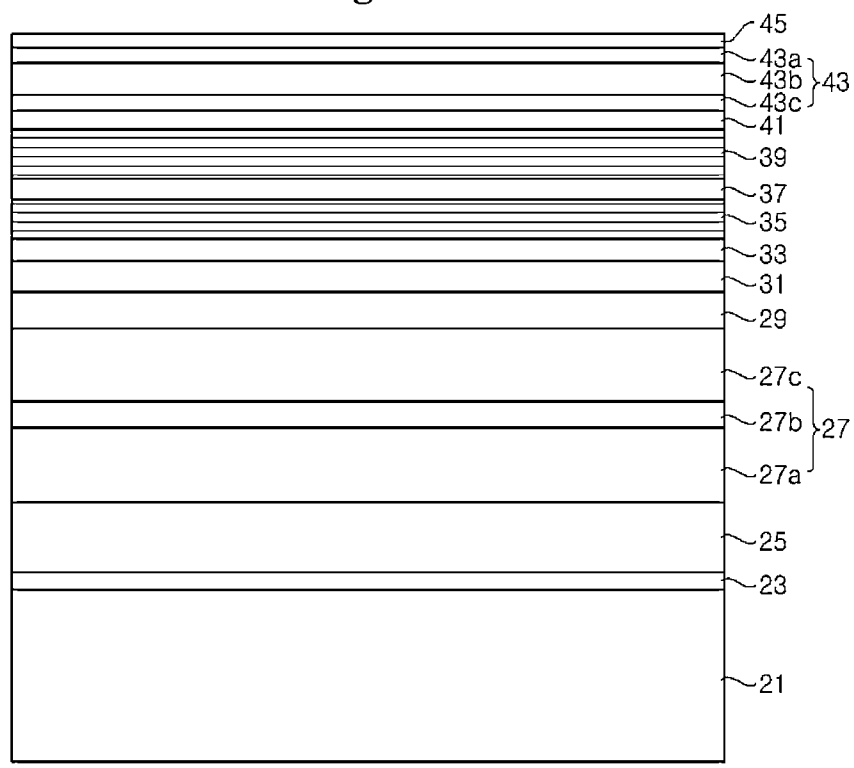
FIG. 1 is a sectional view of a light emitting device according to one exemplary embodiment of the present invention.

Hereinafter, exemplary embodiments of the invention will be described in detail with reference to the accompanying drawings. The following embodiments are given by way of illustration to provide a thorough understanding of the present invention to those skilled in the art. Thus, the present invention is not limited to the following embodiments, and may be realized in various ways. It should be noted that the drawings are not to precise scale and some of the dimensions, such as width, length, thickness, and the like, are exaggerated for clarity of description in the drawings. Like elements are denoted by like reference numerals throughout the specification and drawings. When an element or layer is referred to as being "placed on" or "disposed on" another element or layer, it may be directly "placed on" or "disposed on" the other element or layer or intervening elements or layers may be present. Throughout the specification, like reference numerals denote like elements having the same or similar properties. On the other hand, as used herein, the content of a metal element (Al or In) represented by a percentage is a composition ratio of the metal element to a total sum of metal elements in a gallium nitride-based layer in terms of percentage. That is, the Al content of the gallium nitride-based layer represented by $Al_xIn_yGa_zN$ may be calculated according to $100 \times x/(x+y+z)$ and represented by %.

Figure 2:
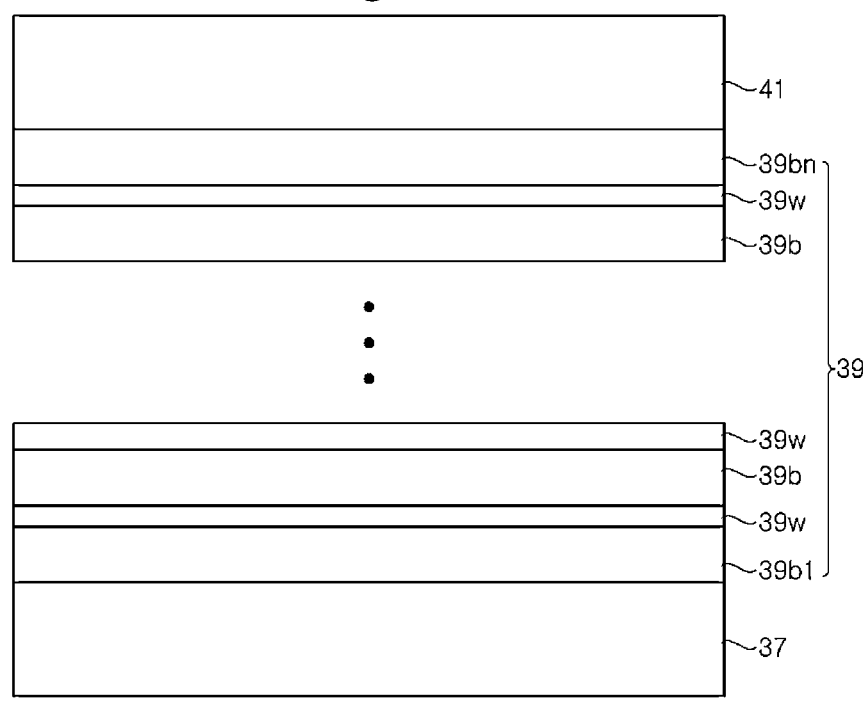
FIG. 2 is a sectional view of a multi-quantum well structure of the light emitting device according to the exemplary embodiment of the present invention.

FIG. 1 is a sectional view of a light emitting device according to one exemplary embodiment of the present invention, and FIG. 2 is a sectional view of a multi-quantum well structure of the light emitting device according to the exemplary embodiment of the present invention.

Referring to FIG. 1, a light emitting device according to one embodiment includes an n-type contact layer 27, an active area 39, and a p-type contact layer 43. Further, the light emitting device may include a substrate 21, a nucleation layer 23, a buffer layer 25, an undoped GaN layer 29, a low-density GaN layer 31, a high-density GaN layer 33, a superlattice layer 35, an electron implantation layer 37, an electron blocking layer 41, or a delta doping layer 45.

The substrate 21 is a substrate for growing a GaN-based semiconductor layer, and includes a sapphire substrate, a silicon carbide (SiC) substrate, or a spinel substrate, without being limited thereto. For example, the substrate 21 may be a patterned sapphire substrate (PSS).

The nucleation layer 23 may be formed of (Al, Ga)N, at temperatures ranging from 400° C. to 600° C., to grow the buffer layer 25 on the substrate 21. The nucleation layer 23 is formed of GaN or AlN. The nucleation layer 23 may be formed to a thickness of about 25 nm. The buffer layer 25 is grown at relatively high temperatures to relieve defect occurrence, such as dislocation, between the substrate 21 and the n-type contact layer 27. For example, the buffer layer 25 may be formed of undoped GaN and may have a thickness of about 1.5 μm.

The n-type contact layer 27 may be an n-type impurity-doped semiconductor layer, for example, Si-doped, GaN-based semiconductor layer, and may be formed to a thickness of about 3 μm. The n-type contact layer 27 may include a GaN layer and may have a single layer or multilayer structure. For example, as shown, the n-type contact layer 27 may include a lower GaN layer 27a, an intermediate layer 27b, and an upper GaN layer 27c. Here, the intermediate layer 27b may be formed of AlInN, or may have a multilayer structure (including a superlattice structure) in which AlInN and GaN are alternately stacked, for example, in about 10 cycles. The lower GaN layer 27a and the upper GaN layer 27c may be formed to similar thicknesses of, for example, about 1.5 μm. The intermediate layer 27b may be formed to a smaller thickness than the lower and the upper GaN layers 27a, 27c. For example, the intermediate layer 27b may have a thickness of about 80 nm. As compared with the case where a single GaN layer is continuously grown at a relatively high thickness of about 3 mm, the intermediate layer 27b is inserted into an intermediate section of the n-type contact layer 27.

As such, crystal quality of an epitaxial layer, specifically, the active area 39 formed on the n-type contact layer 27, can be improved. A doping density of Si doped into the n-type contact layer 127 may range from $2 \times 10^{18}/cm^3$ to $2 \times 10^{19}/cm^3$, or from $1 \times 10^{18}/cm^3$ to $2 \times 10^{19}/cm^3$. In particular, the lower GaN layer 27a and the upper GaN layer 27c may be doped with Si impurities at a high density, and the intermediate layer 27b may be doped with the Si impurities at a lower or the same density as that of the upper GaN 27c, or may not be intentionally doped therewith. Since the lower GaN layer 27a and the upper GaN layer 27c are doped with the Si impurities at a high density, the resistance of the n-type contact layer 27 may be reduced. An electrode contacting the n-type contact layer 27 may contact the upper GaN layer 27c as well.

The undoped GaN layer 29 may be formed of GaN that is not doped with the impurities, and may be formed to a smaller thickness than the upper GaN layer 27c. For example, the undoped GaN layer 29 may have a thickness of 80 nm to 300 nm. As the n-type contact layer 27 is doped with n-type impurities, the n-type contact layer 27 has residual stress and a low crystal quality. Accordingly, when another epitaxial layer is grown on the n-type contact layer 27, it is difficult to grow an epitaxial layer having good crystal quality. However, since the undoped GaN layer 29 is not doped with any impurity, the undoped GaN layer 29 acts as a recovery layer for recovering the crystal quality of the n-type contact layer 27. Thus, the undoped GaN layer 29 may be directly formed on the n-type contact layer 27 to adjoin the n-type contact layer 27. In addition, since the undoped GaN layer 28 has a higher resistivity than the n-type contact layer 27, electrons introduced from the n-type contact layer 27 to the active layer 39 can be evenly distributed within the n-type contact layer 27, before passing through the undoped GaN layer 29.

The low-density GaN layer 31 is placed on the undoped GaN layer 29 and has a lower n-type impurity doping density than the n-type contact layer 27. The low-density GaN layer 31 may have a Si doping density ranging, for example, from $5 \times 10^{17}/cm^3$ to $5 \times 10^{18}/cm^3$ and may be formed to a smaller thickness than the undoped GaN layer 29. For example, the low-density GaN layer 31 may have a thickness of 50 nm to 150 nm. The high-density GaN layer 33 is placed on the low-density GaN layer 31 and has a higher n-type impurity doping density than the low-density GaN layer 31. The high-density GaN layer 33 may have an Si doping density similar to that of the n-type contact layer 27. The high-density GaN layer 33 may have a smaller thickness than the low-density GaN layer 31. For example, the high-density GaN layer 33 may have a thickness of about 30 nm.

The n-type contact layer 27, the undoped GaN layer 29, the low-density GaN layer 31, and the high-density GaN layer 33 may be continuously grown by supplying a metal source gas into a chamber. Organometallic materials including Al, Ga and In, such as trimethylaluminum (TMA), trimethylgallium (TMD), and/or trimethlyindium (TME), are used as a metal source gas. Silane $SiH_4$ may be used as a source gas of Si. These layers may be grown at a first temperature of, for example, 1050° C. to 1150° C.

The superlattice layer 35 is placed on the high-density GaN layer 33. The superlattice layer 35 may be formed by alternately stacking first and second InGaN layers having different compositions in about 30 cycles, in which each of the InGaN layers has a thickness of 20 Å. The indium content of the first and second InGaN layers is lower than that of well layers 39w in the active area 39. The superlattice layer 35 may be formed of an undoped layer without any intentionally doped impurities. Since the superlattice layer 35 is formed of the undoped layer, current leakage of the light emitting device can be reduced.

The electron implantation layer 37 has a higher n-type impurity doping density than the superlattice layer 35. In addition, the electron implantation layer 37 may have substantially the same n-type impurity doping density as the n-type contact layer 27. For example, the n-type impurity doping density may range from $1 \times 10^{19}/cm^3$ to $5 \times 10^{19}/cm^3$, or from $1 \times 10^{19}/cm^3$ to $3 \times 10^{19}/cm^3$. Since the electron implantation layer 37 is doped at a high density, implantation of electrons into the active area 39 can be facilitated. The electron implantation layer 37 may be formed to a similar or smaller thickness than the high-density doping layer 33. For example, the electron implantation layer 37 may have a thickness of 20 nm. Moreover, the electron implantation layer 37 may be grown at a pressure of about 300 ton and a temperature of about 820° C. to 850° C.

The active area 39 is placed on the electron implantation layer 37. FIG. 2 is an enlarged sectional view of the active area 39.

Referring to FIG. 2, the active area 39 has a multi-quantum well structure including barrier layers 39b and well layers 39w, which are alternately stacked one above another. The well layers 39w have a composition capable of emitting near-ultraviolet light ranging from 365 nm to 390 nm. For example, the well layers 39w may be formed of InGaN or AlInGaN, for example. Here, the In content of the well layers 39w is determined according to wavelengths of ultraviolet light. For example, the In content of the well layers 39w may range from about 2% to 5% molar percentage (accordingly, the Ga content ranges from about 95% to 98%). Throughout the present description, content of a compound in the various layers is likewise indicated according to molar percentage. Each of the well layers 39w may have a thickness of about 20 Å to 30 Å. The well layers 39w may be grown at a higher temperature than the well layers of a general blue light emitting diode, for example, 800° C. to 820° C., at a pressure of about 300 Torr. As such, the well layers may have improved crystal quality.

The barrier layers 39b may be formed of gallium nitride-based semiconductor layers having a wider band gap than the well layers. For example, the barrier layers may be formed of GaN, InGaN, AlGaN, or AlInGaN. In particular, since the barrier layers 39b may be formed of AlInGaN and thus, contain In, a lattice mismatch between the well layers 39w and the barrier layers 39b can be relieved.

Furthermore, the barrier layers 39b may be grown at a slightly higher growth temperature than the growth temperature of the well layers 39w. For example, the barrier layers 39b may be grown at temperatures of about 820° C. to 850° C., at a pressure of about 300 Torr.

A first barrier layer 39b1 of the barrier layers 39b1, 39b, 39bn, which is closest to the electron implantation layer 37 or the n-type contact layer 27, has a higher Al content than the other barrier layers. For example, the first barrier layer 39b1 may contain 10% to 20% more Al than the other barrier layers 39b. For example, when the other barrier layers 39b, 39bn include about 20% of Al, the first barrier layer 39b1 may include about 30% to 40% of Al. The barrier layers 39b1, 39b, 39bn contain about 1% or less of indium. In particular, when the well layers 39w are formed of InGaN to emit near-ultraviolet light of 375 nm to 390 nm, the barrier layers 39b and 39bn other than the first barrier layer 39b1 may be formed of AlInGaN which contains 15% to 25% of Al and about 1% or less of In, and the first barrier layer 39b1 may be formed of AlInGaN which contains 30% to 40% of Al and 1% or less of In.

In general, barrier layers are formed to have the same composition in a light emitting device. However, in the present embodiment, the first barrier layer 39b1 contains 10% to 20% more Al than the other barrier layers 39b. The electron implantation layer 37 or the n-type contact layer 27 is formed of GaN. A difference between band gaps of the well layer 39w capable of emitting near-ultraviolet light and GaN is not relatively large. Accordingly, the first barrier layer 39b1 is formed to have a higher band gap than the other barrier layers 39b, thereby confining carriers in the active area 39. In particular, when the AlInGaN barrier layer is used, a moving speed of holes is significantly decreased, whereby an overflow probability of electrons can be increased. In this case, although it can be considered that the thickness of the electron blocking layer 41 is increased to prevent overflow of electrons, an increase in thickness of the electron blocking layer 41 for efficient implantation of holes into the active area is restricted.

Accordingly, the first barrier layer 39b1 is formed to have a wider band gap (about 0.5 eV or higher) than the other barrier layers, to effectively prevent the overflow of electrons, by decreasing the moving speed of the electrons. However, when the Al content of the first barrier layer 39b1 is increased by about 20% or more, a lattice mismatch may occur between the first barrier layer 39b1 and the electron implantation layer 37, and a lattice mismatch between the first barrier layer 39b1 and the well layer 39w may become severe, thereby reducing the crystal quality of the active area 39.

The first barrier layer may have substantially the same or greater thickness (for example, of about 40 Å) than the other barrier layers except for the last barrier layer, which is closest to the electron blocking layer 41 or the p-type contact layer 43. For example, the first barrier layer may have a thickness of 40 Å to 60 Å, specifically about 45 Å.

The active area 39 may adjoin the electron implantation layer 37. The barrier layer and the quantum well layer of the active area 39 may be formed of an undoped layer to improve the crystal quality of the active layer, and some portion or the entirety of the active area may be doped with impurities to reduce forward voltage.

Referring again to FIG. 1, the p-type contact layer 43 may be placed on the active area 39, and the electron blocking layer 41 may be placed between the active area 39 and the p-type contact layer 43. The electron blocking layer 41 may be formed of AlGaN or AlInGaN, to relieve lattice mismatch between the p-type contact layer and the active area 39. The electron blocking layer 41 may contain 36% of Al and 3% of In. The electron blocking layer 41 may be doped with p-type impurities, for example Mg, at a doping density of $5 \times 10^{19}/cm^3$ to $2 \times 10^{20}/cm^3$.

The p-type contact layer 43 may include a lower high-density doping layer 43a, a low-density doping layer 43b, and an upper high-density doping layer 43c. The lower high-density doping layer 43a and the upper high-density doping layer 43c may be doped with p-type impurities, for example Mg, at a doping density of $5 \times 10^{19}/cm^3$ to $2 \times 10^{20}/cm^3$. The low-density doping layer 43b has a lower doping density than the lower and upper high-density doping layers 43a, 43c and is placed therebetween. The low-density doping layer 43b may be grown, with the supply of a source gas Mg (for example, $Cp_2Mg$) interrupted during growth thereof.

During growth of the low-density doping layer 43b, the impurity content may be reduced using $N_2$ gas as a carrier gas instead of using $H_2$. The low-density doping layer 43b is formed to a greater thickness than the upper and lower high-density doping layers 43c, 43a. For example, the low-density doping layer 43b may be formed to a thickness of about 60 nm, and each of the upper and lower high-density doping layers 43c, 43a may be formed to a thickness of 10 nm. As a result, the p-type contact layer 43 has improved crystal quality and a reduced impurity density, thereby preventing or relieving the loss of near-ultraviolet light due to the p-type contact layer 43.

The delta doping layer 45 may be placed on the p-type contact layer 43 to decrease ohmic contact resistance. The delta doping layer 45 is doped with p-type or n-type impurities at a high density to decrease the ohmic resistance between the electrode and the p-type contact layer 43. The delta doping layer 45 may be formed to a thickness of about 2 Å to 5 Å.

A light emitting device of a lateral structure or flip chip structure can be manufactured by patterning the epitaxial layers on the substrate 21. Further, a light emitting device of a vertical structure can be manufactured by removing the substrate 21.

EXPERIMENTAL EXAMPLE 1

Figure 3:
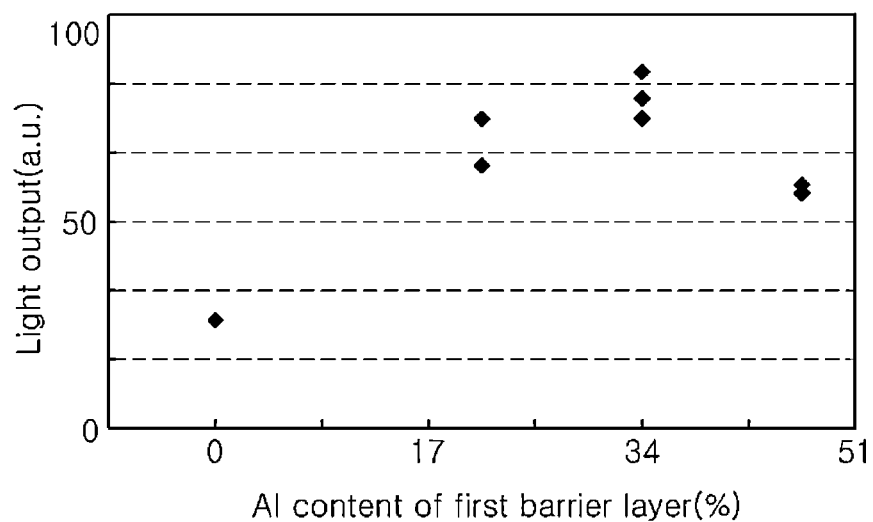
FIG. 3 is a graph depicting light output versus Al content of a first barrier layer of the multi-quantum well structure of the light emitting device according to the exemplary embodiment of the present invention.

In order to check the variation in light output according to the Al content in the first barrier layer 39b closest to the n-type contact layer 27, epitaxial layers were grown by MOCVD under the same conditions, except for the Al content in the first barrier layer. FIG. 3 is a graph depicting light output versus Al content of the first barrier layer. The barrier layers had the same composition except for the first barrier layer. The Al content of the respective barrier layers was measured using an atomic probe, and the other barrier layers contained about 20% of Al.

Referring to FIG. 3, when the Al content of the first barrier layer was 14% higher than those of the other barrier layers, the light emitting device had relatively high light output. On the other hand, when the first barrier layer did not contain Al, the light emitting device had relatively low light output. In addition, when the first barrier layer contained about 47% of Al, which was 27% higher than the Al content of the other barrier layers, a light emitting device sample had smaller light output than other light emitting device samples wherein the first barrier layer had the same Al content than the other barrier layers.

EXPERIMENTAL EXAMPLE 2

Figure 4:
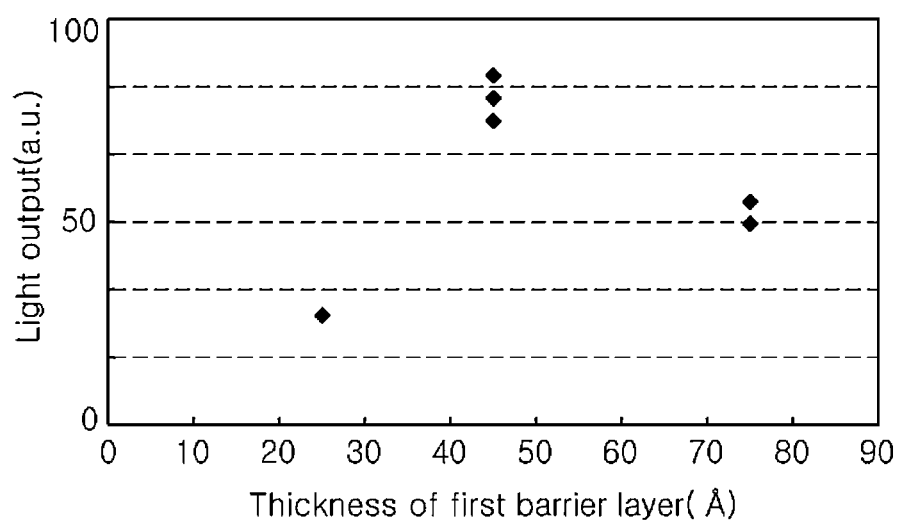
FIG. 4 is a graph depicting light output versus thicknesses of the first barrier layer of the multi-quantum well structure of the light emitting device according to the exemplary embodiment of the present invention.
Figure 5:
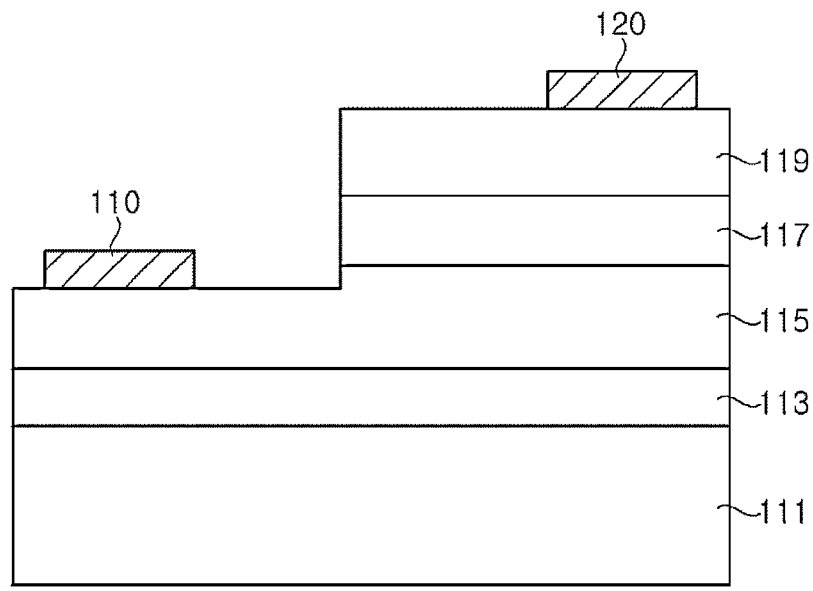
FIG. 5 is a schematic sectional view of a typical light emitting diode.

In order to check light variation in light output according to the thickness of the first barrier layer 39b closest to the n-type contact layer 27, epitaxial layers are grown by MOCVD under the same conditions except for the thickness of the first barrier layer. FIG. 4 is a graph depicting light output versus thickness of the first barrier layer. All of the barrier layers except for the first barrier layer and the last barrier layer closest to the p-type contact layer 43 were formed to a thickness of about 45 Å, and the last barrier layer was formed to a relatively thick thickness of about 75 Å. Moreover, the first barrier layer had an Al content of about 34%, and the other barrier layers had an Al content of about 20%.

Referring to FIG. 4, when the first barrier layer had a thickness of 45 Å, which is the same as the other barrier layers, the light emitting device had relatively high light output. On the other hand, when the first barrier layer had a thickness of 25 Å, the light emitting device had relatively low light output, and even in the case where the first barrier layer had a thick thickness of 75 Å, the light emitting device had relatively low light output.

In a near ultraviolet light emitting device in the related art, an n-type contact layer is formed of AlGaN. Since a contact layer occupying most of the thickness of the near UV light emitting device except for the substrate is formed of AlGaN, light loss by light absorption can be prevented, but it is difficult to improve light output or light extraction efficiency due to low crystal quality of epitaxial layers therein. According to embodiments, since all or most of n-type contact layers and p-type contact layers are formed of gallium nitride, it is possible to improve crystal quality of an active area. Thus, the light emitting device according to the embodiments may have improved light output by preventing light loss due to light absorption.

Furthermore, since a first barrier layer contains a greater amount of Al than other barrier layers, the light emitting device according to the embodiments may have further improved light output. Moreover, the near ultraviolet light emitting device can reduce light loss due to light absorption by enhancing crystal quality of n-type and p-type contact layers.

Figure 7:
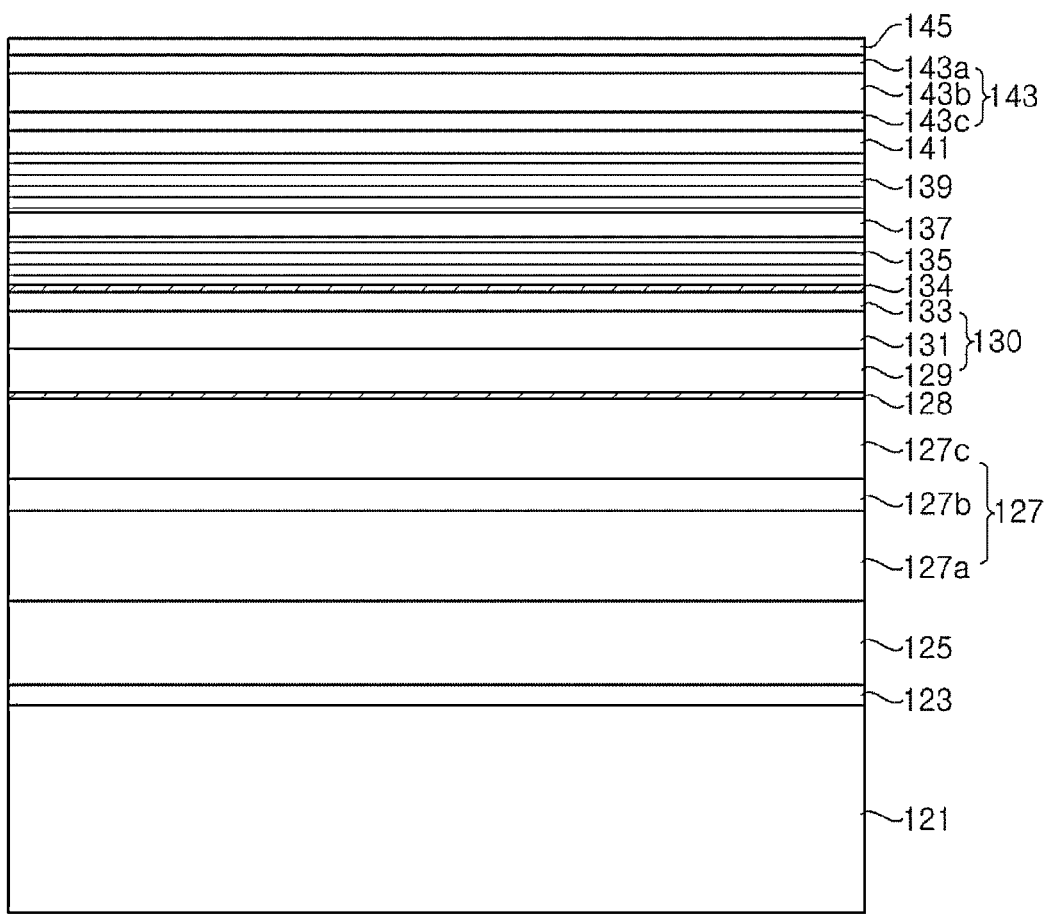
FIG. 7 is a sectional view of a UV light emitting diode according to an exemplary embodiment of the present invention.
Figure 8:
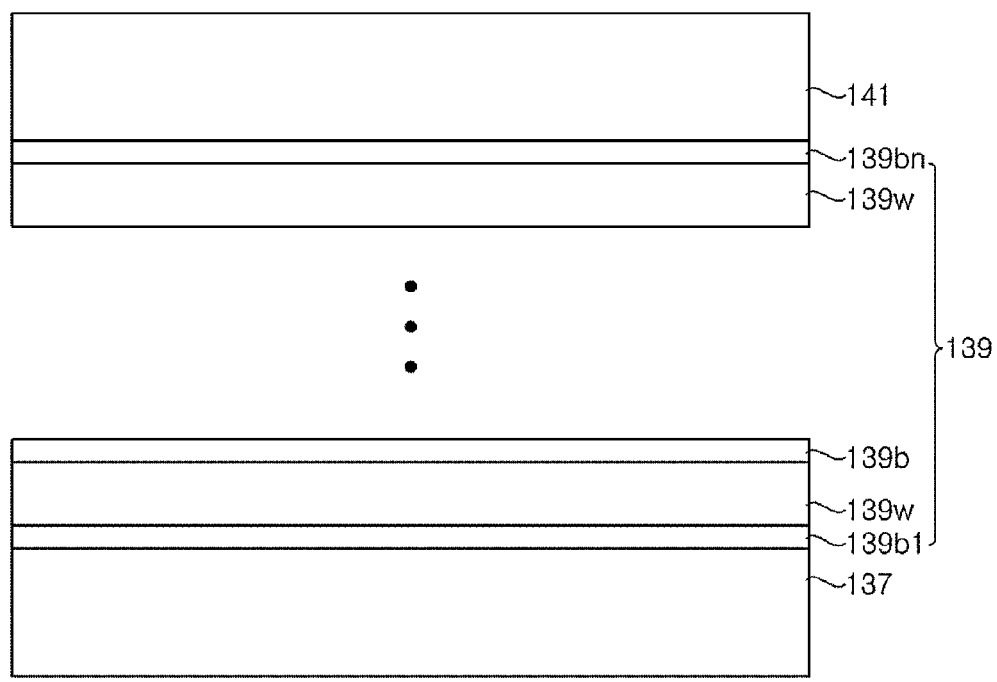
FIG. 8 is a sectional view of a multi-quantum well structure of the UV light emitting diode according to an exemplary embodiment of the present invention.

FIG. 7 is a sectional view of a UV light emitting diode according to another exemplary embodiment of the present invention and FIG. 8 is a sectional view of a multi-quantum well structure of a UV light emitting diode according to an exemplary embodiment of the invention.

Referring to FIG. 7, the UV light emitting diode according to an exemplary embodiment of the present invention includes an n-type contact layer 127, an active area 139, and a p-type contact layer 143. Further, the UV light emitting diode may include a substrate 121, a buffer layer 123, a three-dimensional growth layer 125, an electron implantation layer 137, an electron blocking layer 141, and/or a delta doping layer 145.

The substrate 121 may be a substrate for growing gallium nitride-based semiconductor layers thereon, and may be any substrate such as a sapphire substrate, a SiC substrate, a spinel substrate, and the like. For example, the substrate 121 may be a patterned sapphire substrate (PSS).

The buffer layer 123 may be formed of (Al, Ga)N, for example, GaN or AlGaN, at a low temperature of 400° C. to 600° C. in order to grow the three-dimensional growth layer 125 on the substrate 121. The buffer layer 123 may be formed to a thickness of about 25 nm. The three-dimensional growth layer 125 is placed between the substrate 121 and the n-type contact layer 127 to minimize generation of dislocation defects and the like, and is grown at a relatively high temperature of 700° C. to 900° C. The three-dimensional growth layer 125 may be formed of, for example, undoped GaN, to a thickness of 1 μm to 2 μm.

Figure 6:
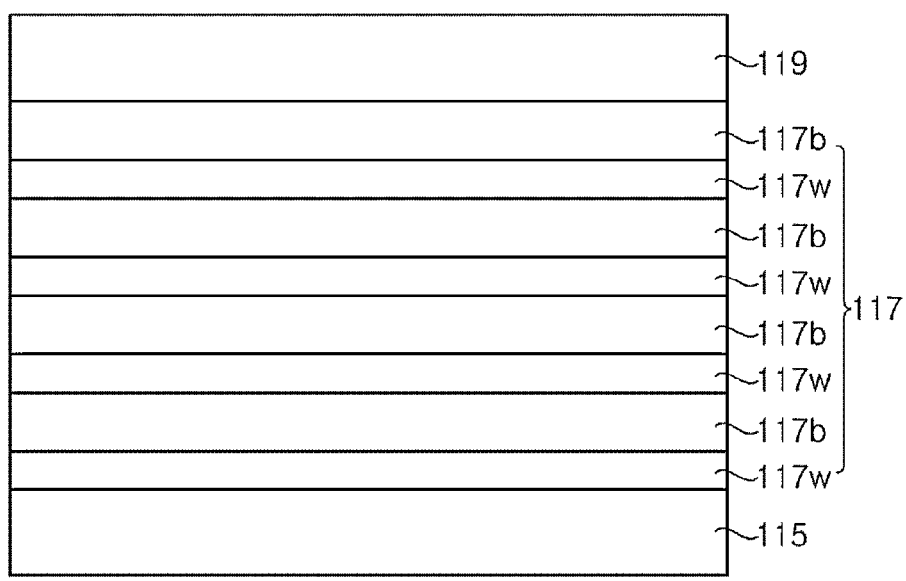
FIG. 6 is an enlarged sectional view of an active area of the light emitting diode of FIG. 5.

The n-type contact layer 127 may be formed as a gallium nitride-based semiconductor layer doped with n-type impurities, for example, Si, and may be formed to a thickness of, for example, about 1 μm to about 3 μm. The n-type contact layer 127 may be composed of AlGaN having an Al content of 2% to 10%, which is higher than that of adjacent layers thereof. The n-type contact layer may be formed in a single layer or multiple layers, in which an AlGaN layer or an AlInGaN layer having a thickness of 5 nm to 30 nm is formed as an intermediate layer. For example, as shown in FIG. 6, the n-type contact layer 127 may include a lower AlGaN layer 127a, an intermediate layer 127b and an upper AlGaN layer 127c. Here, the intermediate layer 127b may be formed of AlInN or AlN, and may be formed in a multilayer structure (including a superlattice structure) in which AlInN or AlGaN and GaN are alternately stacked, for example, in about 4 to 10 pairs. The lower AlGaN layer 127a may have a thickness of about 1.5 μm and the upper AlGaN layer 127c may have a thickness of about 1 μm. The upper AlGaN layer 127c may have an Al content of less than 10%, for example, about 2% to about 9%. On the other hand, the lower AlGaN layer may have a lower Al content than the upper AlGaN layer.

The intermediate layer 127b may have a smaller thickness than the upper AlGaN layer 127c, and may be formed to a total thickness of about 80 nm. The intermediate layer 127b is formed on the lower AlGaN layer 127a and the upper AlGaN layer 127c is formed on the intermediate layer 127b, thereby improving crystallinity of the upper AlGaN layer 127c. The intermediate layer suppresses cracking due to lattice mismatch between the n-type contact layer 127 and the three-dimensional growth layer 125.

Particularly, the lower AlGaN layer 127a and the upper AlGaN 27c are doped with Si impurities in a high concentration of $1E18/cm^3$ or more. The intermediate layer 127b may be doped in the same or higher concentration than the upper AlGaN layer 127c. For example, the intermediate layer 127b may be doped with Si impurities in a high concentration of $1E18/cm^3$ or more. Furthermore, the upper AlGaN layer 127c may include a modulation doped layer formed by repeating doping and undoping. The intermediate layer and the modulation doped layer enhance horizontal dispersion of electrons. An n-electrode (149a in FIG. 9) contacting the n-type contact layer 127 may contact the upper AlGaN layer 127c. Particularly, in fabrication of a vertical type light emitting diode through removal of the substrate 121, the substrate 121 may be removed by radiating a laser beam onto the three-dimensional growth layer 125 (laser lift-off), and a support substrate (not shown) may formed on an upper side of the p-type contact layer 143 and the lower AlGaN layer 127a. The intermediate layer 127b may be is removed through wet etching using a KOH or NaOH solvent.

The electron control layer 128 may have a higher Al content than the n-type contact layer 127 to interrupt a flow of electrons from the n-type contact layer 127 to the active area 139. Since electron mobility is 10 to 100 times higher than hole mobility, a recombination rate of electrons and holes can be increased by balancing transfer rates of the electrons and the holes in the active area 139 by controlling the electron mobility and the hole mobility.

An anti-electrostatic discharge layer 130 is formed to minimize electrostatic discharge impact by realizing a more condensed structure by inserting an undoped layer into doping layers. The anti-electrostatic discharge layer 130 may include an undoped AlGaN layer 129, a low concentration AlGaN layer 131 and a high concentration AlGaN layer 133. The undoped AlGaN 29 may be formed of undoped AlGaN and may have a smaller thickness of, for example, 80 nm to 300 nm, than the upper AlGaN 27c. Since the undoped AlGaN layer 129 has a higher specific resistance than the n-type contact layer 127, the undoped AlGaN layer 129 forms a capacitor between the n-type contact layer 127 and the high concentration AlGaN layer 133. With this structure, the anti-electrostatic discharge layer prevents damage to the active layer by minimizing the effects of reverse voltage resulting from generation of static electricity from the outside. The low concentration AlGaN layer 131 may adjust operating voltage by lowering resistance with respect to electron injection by the undoped layer 29.

The low concentration AlGaN layer 131 is disposed on the undoped AlGaN layer 129 and may have a lower doping concentration of n-type impurities than the n-type contact layer 127. The low concentration AlGaN layer 131 may have a Si-doping concentration in the range of, for example, $5 \times 10^{17}/cm^3$ to $5 \times 10^{18}/cm^3$ and be formed to a smaller thickness of, than the undoped AlGaN layer 129, for example, 50 nm to 120 nm. The high concentration AlGaN layer 133 is disposed on the low concentration AlGaN layer 131 and has a higher doping concentration of n-type impurities than the low concentration AlGaN layer 131. The high concentration AlGaN layer 133 may have substantially the same Si doping concentration as the n-type contact layer 127. The high concentration AlGaN layer 133 may have a smaller thickness, for example, of about 20 nm to about 40 nm, than the low concentration AlGaN layer.

The n-type contact layer 127, the electron control layer 128, the undoped AlGaN layer 129, the low concentration AlGaN layer 131, and the high concentration AlGaN layer 133 may be continuously grown by supplying metal source gases into a growth chamber. Raw materials for the metal source gases may include organic materials of Al, Ga and In, such as TMAl, TMGa, TEGa and/or TMIn. As a source gas of Si, $SiH_4$ may be used. These layers may be grown at a first temperature, for example, at 1050° C. to 1150° C.

The electron control layer 134 is disposed on the anti-electrostatic discharge layer 130. In particular, the electron control layer 134 adjoins the high concentration AlGaN layer 133. The electron control layer 134 may have a higher Al content than the anti-electrostatic discharge layer 130 and may be formed of AlGaN or AlInGaN. For example, the electron control layer 134 may have an Al content in the range of 10% to 30% and an In content in the range of 0% to 5%. The electron control layer 134 may have a thickness of about 1 nm to 10 nm.

The electron control layer 134 may have a higher Al content than the anti-electrostatic discharge layer 130 to interrupt the flow of electrons from the n-type contact layer 127 to the active layer 139. With this structure, the electron control layer 134 may enhance the recombination rate of electrons and holes in the active layer 139 by controlling electron mobility.

The superlattice layer 135 is disposed on the electron control layer 134. The superlattice layer 135 may be formed by alternately stacking a first AlInGaN layer and a second AlInGaN layer having different compositions in about 30 pairs such that each of the first and second AlInGaN layers has a thickness of, for example, 20 Å. The first AlInGaN layer and the second AlInGaN layer may have a higher band gap than the well layers 139w (FIG. 6) in the active area 139. The first AlInGaN layer and the second AlInGaN layer may have a lower In content than the well layers 139w. However, it should be understood that the present invention is not limited thereto. That is, at least one of the first AlInGaN layer and the second AlInGaN layer may have a higher In content than the well layers 139w. For example, one of the first AlInGaN layer and the second AlInGaN layer may have a higher In content of about 1% than the other AlInGaN layer and may have an Al content of about 8%. The superlattice layer 135 may be an undoped layer. When the superlattice layer 135 is an undoped layer, it is possible to reduce current leakage of the light emitting diode.

Since the superlattice layer 135 has an average value of overall lattice parameters corresponding to an intermediate value of the well layers of the active area, the superlattice layer 135 may act as a lattice mismatch relief layer with respect to the active area formed thereon, thereby improving internal quantum efficiency by reducing piezoelectric effects due to lattice mismatch between the active area and other layers.

The electron implantation layer 137 has a higher doping concentration of n-type impurities than the superlattice layer 135. Furthermore, the electron implantation layer 137 may have a same or higher concentration of the n-type impurities than the n-type contact layer 127. For example, the electron implantation layer 137 may have a doping concentration of n-type impurities in the range of $2\times10^{18}/cm^3$ to $2\times10^{19}/cm^3$, for example, $1\times10^{19}/cm^3$ to $2\times10^{19}/cm^3$. The electron implantation layer 137 may have a similar or smaller thickness than the high concentration AlGaN layer 133. For example, the electron implantation layer 137 may have a thickness of about 20 nm to about 100 nm. The electron implantation layer 137 may be formed of, for example, ALInGaN, and may have an In content of 0% to 5% in order to improve electron mobility.

The active area 139 may be disposed on the electron implantation layer 137. FIG. 8 is an enlarged sectional view of the active area 139.

Referring to FIG. 8, the active area 139 has a multi-quantum well structure including barrier layers 139b and well layers 139w alternately stacked one above the other. The well layers 139w may have a composition capable of emitting UV light of 400 nm or less. For example, the well layers 139w may be formed of GaN, InGaN or AlInGaN. When the well layers 139w are formed of InGaN, the In content of the well layers may be depend upon a desired wavelength of UV light. For example, the well layers 139w may have an In content of about 5% or less. Each of the well layers 139w may have a thickness of about 3 nm to about 4 nm. Electrons and holes may be injected into each of the well layers. Then, when the electrons and holes injected into the well layer are confined therein, each of the electrons and holes cannot be regarded as a single particle. That is, the electrons and the holes confined in the well layer are probabilistically present within the quantum well structure according to the probability distribution.

The barrier layers 139b may be formed of a gallium nitride-based semiconductor, for example, AlGaN or AlInGaN, which has a higher band gap than the well layers, and may be represented by $Al_xIn_yGa_{1-x-y}N$ ($0 \leq x \leq 1$, $0 \leq y \leq 1$). Particularly, the barrier layers 139b may have an In content of 1% or less to reduce lattice mismatch between the well layers 139w and the barrier layers 139b while preventing deterioration in crystallinity of the barrier layers by increasing the Al content. The barrier layers may have a lower In content than the well layers. In exemplary embodiments, the barrier layers 139b may be formed of AlGaN or AlInGaN. Here, the barrier layers 139b may have an Al content of 10% to 30%. Each of the barrier layers 139b may have a thickness of 2 nm to 3 nm. Further, the thickness of each of the barrier layers 139b may be 50% to less than 100% that of each of the well layers 139w. The thickness of the barrier layers 139b is inversely proportional to the Al content. That is, when the barrier layer has an Al content of 30%, even a barrier layer 139b having a thickness of 2 nm can prevent the probability distributions of electrons and holes in the well layers adjacent to the barrier layer 139b from overlapping each other.

At least one of the barrier layers 139b may have a different thickness than the other barrier layers, and, among the plural barrier layers 139b, one barrier layer may have a higher Al content and a smaller thickness than another barrier layer. That is, the barrier layers 139b may have different thicknesses and different band gaps.

The barrier layers 139b may have an Al content of 10% to 30% and thus have a higher band gap than the well layers 139w. Thus, according to an exemplary embodiment, although the barrier layers 139b have a smaller thickness than the well layers 139w, it is possible to secure a sufficient skin depth of the barrier layers capable of preventing the probability distributions of adjacent well layers 139w from overlapping each other. Thus, the UV light emitting diode according to the exemplary embodiment of the invention may improve internal quantum efficiency while reducing drive voltage.

Referring again to FIG. 7, the p-type contact layer 143 may be disposed on the active layer 139 and the electron blocking layer 141 may be placed between the active layer 139 and the p-type contact layer 143. The electron blocking layer 141 may be formed of AlGaN or AlInGaN by stacking these layers in plurality. When the electron blocking layer 141 is formed of AlInGaN between the active area 139 and the p-type contact layer 143, it is possible to further reduce lattice mismatch between the active area 139 and the p-type contact layer 143. Here, the electron blocking layer 141 may have an Al content of, for example, about 40%. The electron blocking layer 141 may be doped with p-type impurities, for example, Mg, or may be formed as an undoped layer. The electron blocking layer 141 may have a thickness of about 15 nm.

The p-type contact layer 143 may be formed of an Mg-doped AlGaN layer or AlInGaN layer. For example, the p-type contact layer 143 may have an Al content of about 8% and a thickness of 50 nm to 100 nm. The p-type contact layer 143 may be composed of a single layer, but is not limited thereto. As shown, the p-type contact layer 143 may include a lower high concentration-doping layer 143a, a middle high concentration-doping layer 143b, and an upper high concentration-doping layer 143c. The middle high concentration-doping layer 143b has a lower doping concentration than the lower and upper high concentration-doping layers 143a and 143c, and is disposed between the lower high concentration-doping layer 143a and the upper high concentration-doping layer 143c. The middle high concentration-doping layer 143b may be grown by blocking supply of Mg source gas (for example, Cp2Mg). Furthermore, during growth of the low high concentration-doping layer 143b, the Mg content may be reduced using $N_2$ gas as a carrier gas except for $H_2$ gas. Further, the middle high concentration-doping layer 143b may be formed to a greater thickness than the lower and upper high concentration-doping layers 143a and 143c. For example, the middle high concentration-doping layer 143b may be formed to a thickness of about 60 nm and each of the lower and upper high concentration-doping layers 143a and 143c may be formed to a thickness of about 10 nm. With this structure, it is possible to prevent or reduce loss of UV light by the p-type contact layer 143 by improving crystallinity of the p-type contact layer 143 while lowering the impurity concentration thereof.

The delta doping layer 145 may be disposed on the p-type contact layer 143 to reduce ohmic contact resistance. The delta doping layer 145 may be doped with n-type or p-type impurities in a high concentration to reduce ohmic resistance between an electrode formed thereon and the p-type contact layer 143. The delta doping layer 145 may have a thickness of about 2 Å to 5 Å.

Figure 9:
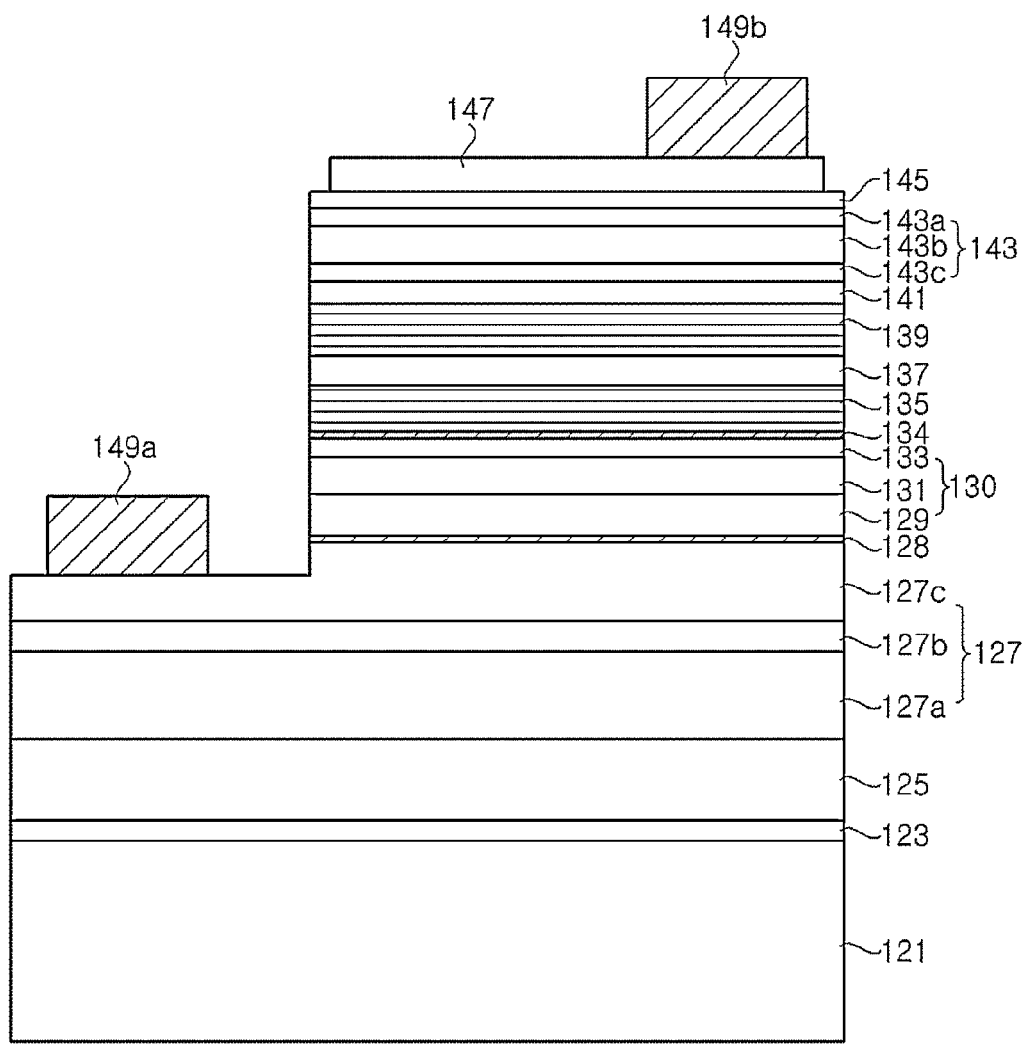
FIG. 9 is a sectional view of a UV light emitting diode including electrodes according to an exemplary embodiment of the present invention.

FIG. 9 is a sectional view of a UV light emitting diode including electrodes according to an exemplary embodiment of the invention. FIG. 9 shows a lateral type light emitting diode formed by patterning epitaxial layers grown on a substrate 121.

Referring to FIG. 9, the light emitting diode includes a transparent electrode 47, an n-electrode 149a, and a p-electrode 149b in addition to the substrate 121 and the epitaxial layers described with reference to FIG. 7.

The transparent electrode 147 may be formed of, for example, indium tin oxide (ITO). The p-electrode 149b is disposed on the transparent electrode 47. The n-electrode 149a contacts an exposed region of an n-type contact layer 127 formed by etching the epitaxial layers. Particularly, the n-electrode 149a contacts an upper surface of an upper AlGaN layer 127c. The electron control layer 128 is placed on the n-type contact layer 127, which the n-electrode 149a contacts, and interrupts the flow of electrons from the n-type contact layer 127 to the active layer 139.

Although this embodiment is illustrated with reference to the lateral type light emitting diode, it should be understood that exemplary embodiments of the present invention are not limited thereto. A flip-chip type light emitting diode may be fabricated by patterning the epitaxial layers grown on the substrate 121, or a vertical type light emitting diode may be fabricated by removing the substrate 121.

Figure 10:
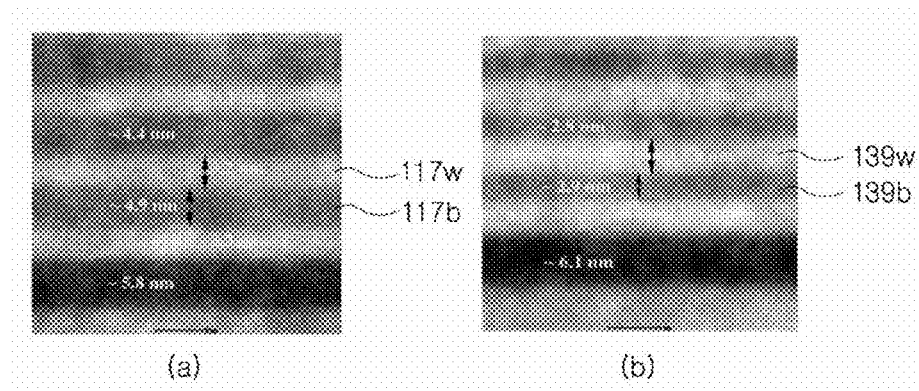
FIG. 10 shows transmission electron microscopy (TEM) micrographs of multi-quantum well structures of a typical UV light emitting diode and a UV light emitting diode according to an exemplary embodiment of the present invention.

FIG. 10 shows transmission electron microscopy (TEM) micrographs of multi-quantum well structures of a typical UV light emitting diode and a UV light emitting diode according to an exemplary embodiment of the present invention. FIG. 10 (a) is a TEM micrograph of the multi-quantum well structure of the typical light emitting diode in the related art and FIG. 10(b) is a TEM micrograph of the multi-quantum well structure of the UV light emitting diode according to the exemplary embodiment of the invention.

Referring to FIG. 10(a), in the multi-quantum well structure of the typical light emitting diode in the related art, well layers 117w have a thickness of about 3.2 nm and barrier layers 117b have a thickness of about 4.9 nm. Referring to FIG. 10 (b), in the multi-quantum well structure of the UV light emitting diode according to an exemplary embodiment of the present invention, the well layers 139w have a thickness of about 3.7 nm and the barrier layers 139b have a thickness of about 2.9 nm.

Figure 11:
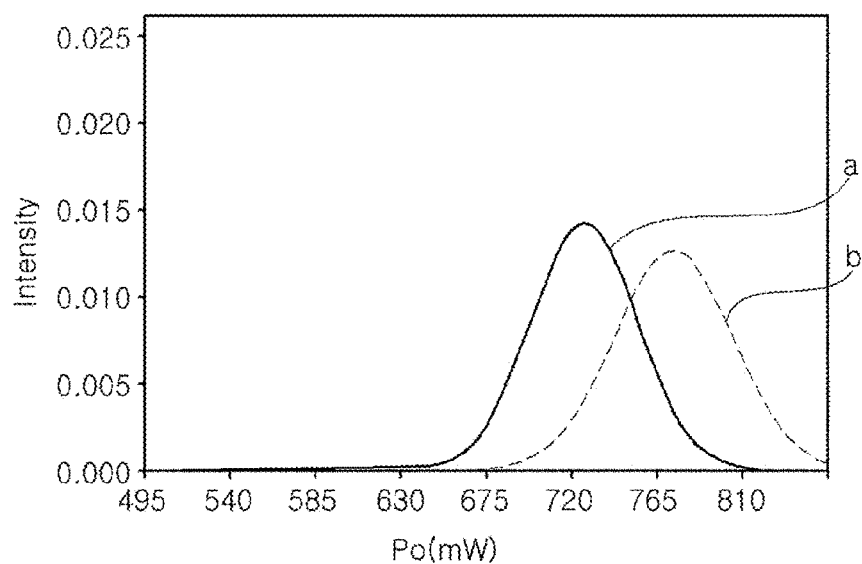
FIG. 11 is a graph depicting intensity of light emitted from the typical UV light emitting diode and the UV light emitting diode according to an exemplary embodiment of the present invention.

FIG. 11 is a graph depicting intensity of light emitted from a typical UV light emitting diode and a UV light emitting diode according to an exemplary embodiment of the present invention. In FIG. 11, line a indicates the intensity of light emitted from the typical UV light emitting diode and line b indicates the intensity of light emitted from the UV light emitting diode according to the exemplary embodiment of the invention.

Referring to FIG. 11, it can be seen that, when the same drive current is applied to the UV light emitting diodes having the same chip structure, the UV light emitting diode according to the exemplary embodiment emits light having higher intensity than the typical UV light emitting diode. Assuming that both UV light emitting diodes have the same light extraction efficiency due to the same chip structure, it can be confirmed that the UV light emitting diode according to the exemplary embodiment has improved internal quantum efficiency.

Exemplary embodiments of the present invention provide a UV light emitting diode, in which barrier layers have a thinner thickness and a higher band gap than well layers to prevent electrons and holes injected into and confined in a well layer from spreading into adjacent well layers therethrough, thereby reducing drive voltage of the UV light emitting diode while improving internal quantum efficiency.

Exemplary embodiments of the present invention provide a light emitting diode that has a high band gap to allow electrons and holes to be uniformly transferred to each of well layers, thereby improving internal quantum efficiency.

Exemplary embodiments of the present invention provide a UV light emitting diode in which barrier layers do not interrupt injection of electrons and holes into well layers, thereby enabling operation at low drive voltage.

Exemplary embodiments of the present invention provide a UV light emitting diode, in which barrier layers have a thinner thickness than well layers while preventing probability distributions of electrons and holes of well layers from overlapping each other in the barrier layer.

Exemplary embodiments of the present invention provide a UV light emitting diode, in which barrier layers have a thinner thickness and a higher band gap than well layers to prevent electrons and holes injected into each of the well layers from spreading into adjacent well layers.

Exemplary embodiments of the present invention provide a UV light emitting diode, in which barrier layers have a thinner thickness than well layers and a suitable composition capable of solving a problem of transition of electrons and holes into adjacent well layers.

It will be apparent to those skilled in the art that various modifications and variation can be made in the present invention without departing from the spirit or scope of the invention. Thus, it is intended that the present invention cover the modifications and variations of this invention provided they come within the scope of is the appended claims and their equivalents.

What is claimed is:

1. An ultraviolet (UV) light emitting diode, comprising:
   an n-type contact layer comprising an AlGaN layer or an AlInGaN layer;
   a p-type contact layer comprising an AlGaN layer or an AlInGaN layer; and
   a multi-quantum well structured active area disposed between the n-type contact layer and the p-type contact layer, the active area comprising well layers and barrier layers alternately stacked, wherein:
   the barrier layers are formed of AlInGaN or AlGaN and comprise Al in an amount of 10% to 30%;
   at least one of the barrier layers disposed between the well layers has a smaller thickness than at least one of the well layers; and
   at least one of the barrier layers disposed between the well layers has a thickness and a band gap provided in a set ratio to prevent electrons and holes injected into and confined in a first well layer adjacent to a barrier layer from spreading into a second adjacent well layer,
   wherein the p-type contact layer comprises a lower high concentration-doping layer, an upper high concentration-doping layer, and a low concentration-doping layer disposed between the lower high concentration-doping layer and the upper high concentration-doping layer.

2. The light emitting diode according to claim 1, wherein the at least one of the barrier layers disposed between the well layers has a thickness of 50% to less than 100% of the thickness of at least one of the well layers.

3. The light emitting diode according to claim 1, wherein the at least one of the barrier layers has a thickness of 2 nm to 3 nm and one of the well layers has a thickness of greater than 3 nm to 4 nm.

4. The light emitting diode according to claim 1, wherein the well layers have an In content of 5% or less, the barrier layers have an In content of 1% or less, and the In content of the barrier layers is lower than the In content of the well layers.

5. The light emitting diode according to claim 1, wherein the well layers have an Al content of 5% or less, the barrier layers have an Al content of 10% to 30%, and the thickness of each of the barrier layers is inversely proportional to the Al content contained therein.

6. The light emitting diode according to claim 1, further comprising:
at least one electron control layer disposed between the n-type contact layer and the active area, the at least one electron control layer comprising AlInGaN or AlGaN and having a higher Al content than adjacent layers thereof.

7. The light emitting diode according to claim 1, wherein the n-type contact layer comprises a modulation doped AlGaN layer.

8. An ultraviolet (UV) light emitting diode, comprising:
an n-type contact layer comprising an AlGaN layer or an AlInGaN layer;
a p-type contact layer comprising an AlGaN layer or an AlInGaN layer; and
a multi-quantum well structured active area disposed between the n-type contact layer and the p-type contact layer, the active area comprising well layers and barrier layers alternately stacked, wherein:
the barrier layers are formed of AlInGaN or AlGaN and comprise Al in an amount of 10% to 30%;
at least one of the barrier layers disposed between the well layers has a smaller thickness than at least one of the well layers; and
at least one of the barrier layers disposed between the well layers has a thickness and a band gap provided in a set ratio to prevent electrons and holes injected into and confined in a first well layer adjacent to a barrier layer from spreading into a second adjacent well layer,
wherein the n-type contact layer comprises a lower GaN layer, an upper AlGaN layer, and an intermediate layer comprising a multilayer structure disposed between the lower GaN layer and the upper AlGaN layer.

9. The light emitting diode according to claim 8, wherein the intermediate layer of the multilayer structure comprises at least one pair of alternately stacked AlGaN and GaN layers.

10. The light emitting diode according to claim 8, wherein the at least one of the barrier layers disposed between the well layers has a thickness of 50% to less than 100% of the thickness of at least one of the well layers.

11. The light emitting diode according to claim 8, wherein the at least one of the barrier layers has a thickness of 2 nm to 3 nm and one of the well layers has a thickness of greater than 3 nm to 4 nm.

12. The light emitting diode according to claim 8, wherein the well layers have an In content of 5% or less, the barrier layers have an In content of 1% or less, and the In content of the barrier layers is lower than the In content of the well layers.

13. The light emitting diode according to claim 8, wherein the well layers have an Al content of 5% or less, the barrier layers have an Al content of 10% to 30%, and the thickness of each of the barrier layers is inversely proportional to the Al content contained therein.

14. An ultraviolet (UV) light emitting diode, comprising:
an n-type contact layer comprising an AlGaN layer or an AlInGaN layer;
a p-type contact layer comprising an AlGaN layer or an AlInGaN layer; and
a multi-quantum well structured active area disposed between the n-type contact layer and the p-type contact layer, the active area comprising well layers and barrier layers alternately stacked, wherein:
the barrier layers are formed of AlInGaN or AlGaN and comprise Al in an amount of 10% to 30%;
at least one of the barrier layers disposed between the well layers has a smaller thickness than at least one of the well layers;
at least one of the barrier layers disposed between the well layers has a thickness and a band gap provided in a set ratio to prevent electrons and holes injected into and confined in a first well layer adjacent to a barrier layer from spreading into a second adjacent well layer;
a superlattice layer disposed between the n-type contact layer and the active area; and
an electron injection layer disposed between the superlattice layer and the active area, the electron injection layer having a higher doping concentration of n-type impurities than the superlattice layer.

15. The light emitting diode according to claim 14, further comprising:
an undoped AlGaN layer disposed between the n-type contact layer and the superlattice layer;
a low concentration AlGaN layer disposed between the undoped AlGaN layer and the superlattice layer and doped with n-type impurities in a lower concentration than the n-type contact layer; and
a high concentration AlGaN layer disposed between the low concentration AlGaN layer and the superlattice layer and doped with n-type impurities in a higher concentration than the low concentration AlGaN layer.

16. The light emitting diode according to claim 14, wherein the at least one of the barrier layers disposed between the well layers has a thickness of 50% to less than 100% of the thickness of at least one of the well layers.

17. The light emitting diode according to claim 14, wherein the at least one of the barrier layers has a thickness of 2 nm to 3 nm and one of the well layers has a thickness of greater than 3 nm to 4 nm.

18. The light emitting diode according to claim 14, wherein the well layers have an In content of 5% or less, the barrier layers have an In content of 1% or less, and the In content of the barrier layers is lower than the In content of the well layers.

19. The light emitting diode according to claim 14, wherein the well layers have an Al content of 5% or less, the barrier layers have an Al content of 10% to 30%, and the thickness of each of the barrier layers is inversely proportional to the Al content contained therein.

* * * * *